(12) United States Patent
Wang et al.

(10) Patent No.: US 10,444,557 B2
(45) Date of Patent: Oct. 15, 2019

(54) DISPLAY MODULE AND DISPLAY DEVICE

(71) Applicant: BOE Technology Group Co., Ltd., Beijing (CN)

(72) Inventors: Zifeng Wang, Beijing (CN); Yan Ren, Beijing (CN); Nannan Hu, Beijing (CN); Lei Cao, Beijing (CN); She Lin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/743,180

(22) PCT Filed: Apr. 5, 2017

(86) PCT No.: PCT/CN2017/079442
§ 371 (c)(1),
(2) Date: Jan. 9, 2018

(87) PCT Pub. No.: WO2017/177848
PCT Pub. Date: Oct. 19, 2017

(65) Prior Publication Data
US 2019/0011760 A1    Jan. 10, 2019

(30) Foreign Application Priority Data
Apr. 13, 2016 (CN) .......................... 2016 1 0228560

(51) Int. Cl.
*G02F 1/1333* (2006.01)
*G02F 1/133* (2006.01)
(Continued)

(52) U.S. Cl.
CPC ........ *G02F 1/133385* (2013.01); *F21V 29/70* (2015.01); *G02F 1/133* (2013.01);
(Continued)

(58) Field of Classification Search
CPC . G02F 1/133308; F21V 29/70; H05K 1/0203; H05K 7/2039; H05K 7/20963
See application file for complete search history.

(56) References Cited

U.S. PATENT DOCUMENTS 6,703,702 B2    3/2004 Inoue et al.
7,414,204 B2    8/2008 Ahn et al.
(Continued)

FOREIGN PATENT DOCUMENTS

CN        1402319 A    3/2003
CN        1612679 A    5/2005
(Continued)

OTHER PUBLICATIONS

First Office Action, including Search Report, for Chinese Patent Application No. 201610228560.1, dated May 30, 2018, 16 pages.
(Continued)

*Primary Examiner* — Nathanael R Briggs
(74) *Attorney, Agent, or Firm* — Westman, Champlin & Koehler, P.A.

(57) ABSTRACT

The present disclosure relates to a display module and a display device. The display module includes a display panel, at least one chip-on-film, a printed circuit board and a cover plate, wherein: the printed circuit board is located on a back side of the display panel; one end of the chip-on-film is connected with the display panel, the other end of the chip-on-film is bent towards the back side of the display panel and is connected with a printed circuit board, with a chip being packaged in a portion of the chip-on-film which is bent towards the back side of the display panel; the cover plate is located on the back side of the printed circuit board and covers the same; the cover plate is provided with thermal conductive blocks which are in thermal contact with the chip at each location of the cover plate corresponding to one of the chip-on-film respectively. The display module
(Continued)

according to the present disclosure improves the assembly convenience of the display module, improves the heat dissipation performance of the chip, and further improves the product quality of the display device.

19 Claims, 3 Drawing Sheets

(51) Int. Cl.
*F21V 29/70* (2015.01)
*H05K 1/02* (2006.01)
*H05K 7/20* (2006.01)

(52) U.S. Cl.
CPC ...... *G02F 1/1333* (2013.01); *G02F 1/133308* (2013.01); *H05K 1/0203* (2013.01); *H05K 7/2039* (2013.01); *H05K 7/20963* (2013.01)

(56) References Cited

U.S. PATENT DOCUMENTS

| | | | |
|---|---|---|---|
| 7,839,396 B2 | 11/2010 | Yang et al. | |
| 7,903,226 B2 | 3/2011 | Yuge | |
| 8,081,288 B2 | 12/2011 | Yuge | |
| 9,075,261 B2 | 7/2015 | Zhang et al. | |
| 9,417,494 B2 | 8/2016 | Kim et al. | |
| 2003/0020152 A1* | 1/2003 | Inoue | H01L 23/057 257/684 |
| 2005/0093429 A1 | 5/2005 | Ahn et al. | |
| 2007/0171354 A1 | 7/2007 | Yuge | |
| 2008/0018626 A1 | 1/2008 | Yang et al. | |
| 2008/0111950 A1* | 5/2008 | Hong | G02B 6/0083 349/65 |
| 2011/0097962 A1 | 4/2011 | Yuge | |
| 2013/0162506 A1 | 6/2013 | Kim et al. | |
| 2015/0103303 A1 | 4/2015 | Zhang et al. | |

FOREIGN PATENT DOCUMENTS

| | | |
|---|---|---|
| CN | 101008728 A | 8/2007 |
| CN | 101109857 A | 1/2008 |
| CN | 101373744 A | 2/2009 |
| CN | 102723315 A | 10/2012 |
| CN | 103176303 A | 6/2013 |
| CN | 204269982 U | 8/2015 |
| CN | 205103518 U | 3/2016 |
| CN | 105676502 A | 6/2016 |
| CN | 205539814 U | 8/2016 |
| EP | 1 282 169 A3 | 10/2005 |
| KR | 20050122958 A | 12/2005 |
| KR | 100730133 B1 | 6/2007 |

OTHER PUBLICATIONS

International Search Report and English translation of international Search Report for international Application No. PCT/CN2017/079442, dated Jun. 8, 2017, 8 pages.

Written Opinion and English translation of Box No. 5 of Written Opinion for international Application No. PCT/CN2017/079442, dated Apr. 5, 2017, 7 pages.

* cited by examiner

DISPLAY MODULE AND DISPLAY DEVICE

CROSS-REFERENCE TO RELATED APPLICATION

This application is a Section 371 National Stage Application of International Application No. PCT/CN2017/079442, filed Apr. 5, 2017, and published as WO 2017/177848 A1 on Oct. 19, 2017, and claims the benefit of Chinese Patent Application No. 201610228560.1 filed on Apr. 13, 2016 in the State Intellectual Property Office of China, the whole disclosure of which are incorporated herein by reference.

BACKGROUND OF THE INVENTION

Field of the Invention

The present disclosure relates to the technical field of display, and in particular to a display module and a display device.

Description of the Related Art

As consumers' requirements to image quality of the display device are becoming more demanding, an amount of system signals and power information handled by the chip of a thin film transistor liquid crystal display (referred to as TFT-LCD) is also becoming even larger, and an increase in loading capacity necessarily brings about more heat generation. Therefore, a good heat dissipation is needed. Solutions which are generally adopted in the conventional heat dissipation of the chip lie in that: a heat dissipation patch covering the chip is attached to the COF so as to cool the chip.

The conventional technology has the drawback lying in that, since both the COF and the heat dissipation patch have certain flexibility, it is necessary to keep the COF and the heat dissipation patch to be flattened and smooth, when the heat dissipation patch is bonded to the COF. Such an operation is very inconvenient. In particular, a large-size display module has dozens of COFs which makes the operation cumbersome and time-consuming. In addition, after the COF and the heat dissipation patch are bonded together, if the heat dissipation patch needs to be removed, the COF and the heat dissipation patch tends to pull each other due to a relative large bonding force existing therebetween, so that there is a poor contact between the COF and the liquid crystal panel or the printed circuit board. However, if the COF and the heat dissipation patch are not firmly bonded to each other, a gap may thus be formed therebetween, resulting in that the heat dissipation effect will be greatly compromised.

For a non-TFT-LCD display product, such as an OLED (Organic Light-Emitting Diode) product, the heat dissipation structure of the chip thereof is similar to that described above, thus similar technical problems to those described above may also exist.

SUMMARY OF THE INVENTION

According to an aspect of the present disclosure, there is provided a display module, comprising a display panel, at least one chip-on-film, a printed circuit board and a cover plate, wherein, the printed circuit board is located on a back side of the display panel;

the chip-on-film is connected with the display panel at one end thereof, the other end of the chip-on-film is bent towards the back side of the display panel and is connected with a printed circuit board, at the other end thereof, with a chip being packaged in a portion of the chip-on-film which is bent towards the back side of the display panel;

the cover plate is located on the back side of the printed circuit board and covers the same; the cover plate is provided with thermal conductive blocks which are in thermal contact with the chip at each location of the cover plate corresponding to one of the chip-on-film respectively.

Optionally, the thermal conductive block is a thermal conductive rubber block.

Optionally, a notch is provided at each position of the cover plate corresponding to one of the chip-on-film, and the thermal conductive blocks are fitted in the notches by interference fit respectively.

Optionally, the thermal-conducting block comprises a first stopper and a second stopper positioned on either side of the cover plate respectively, and a connecting portion fitted with the notches by interference fit.

Optionally, a pair of limiting protrusions are provided at the entrance of the notch.

Optionally, the display module further comprises a front frame and a metal back housing connected with the front frame, with the display panel, the at least one chip-on-film, the printed circuit board and the cover plate being located between the front frame and the metal back housing, and the thermal conductive blocks being in thermal contact with the metal back housing.

Optionally, the display module further comprises a front frame and a metal back housing connected with the front frame, and a heat sink is provided inside the metal back housing, with the display panel, the at least one chip-on-film, the printed circuit board and the cover plate being located between the front frame and the metal back housing, and the thermal conductive blocks being in thermal contact with the heat sink.

Optionally, the heat sink is bonded by adhesive onto the inner surface of the back housing.

Optionally, the heat sink has a laminated structure which comprises at least one of a graphite layer, a metal layer, and a thermal conductive adhesive layer.

According to another aspect of the present disclosure, there is provided a display device, comprising the display module according to any one of above solutions.

DETAILED DESCRIPTION OF PREFERRED EMBODIMENTS OF THE INVENTION

Figure 1:
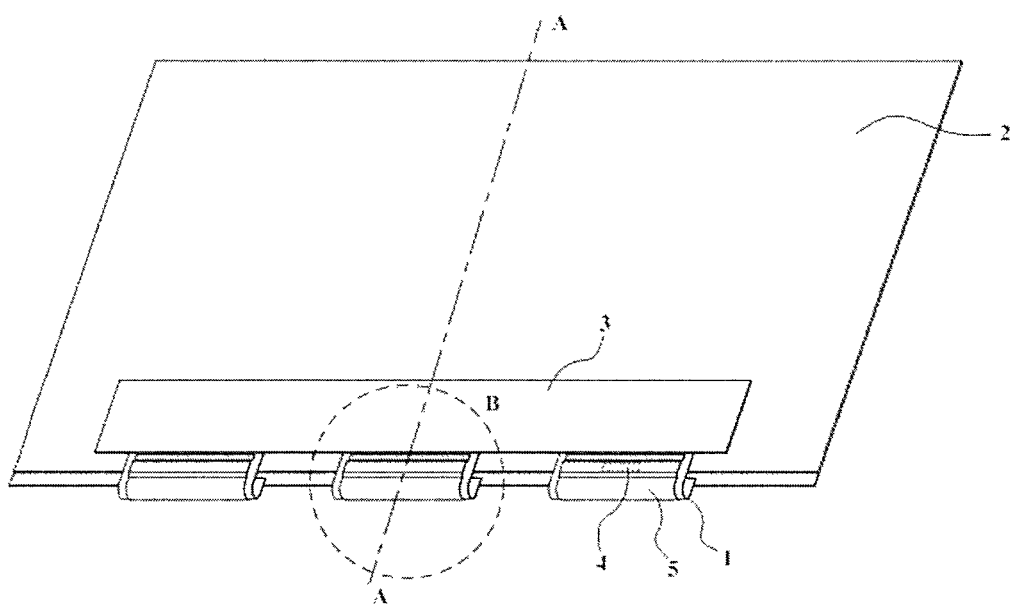
FIG. 1 is a schematic diagram of a heat dissipation structure of a chip of a conventional display module.
Figure 2:
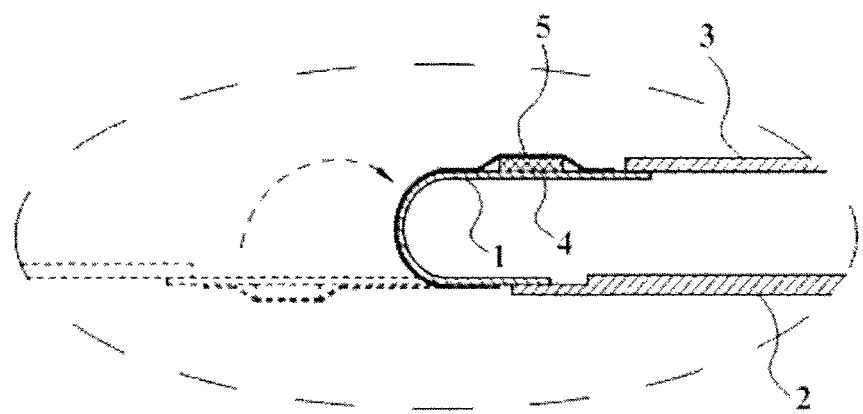
FIG. 2 is an enlarged sectional view at position B in FIG. 1.

FIG. 1 is a schematic view of a heat dissipation structure of a chip of a conventional display module and FIG. 2 is an enlarged sectional view at B in FIG. 1, respectively. As shown in FIG. 1 and FIG. 2, in a conventional TFT-LCD, a chip-on-film (referred to as COF) 1 is connected between a liquid crystal panel 2 and a printed circuit board 3, and is bent towards a backside of a back plate of a back light module from a periphery of the liquid crystal panel 2 (the backlight module, and a cover plate as set forth hereinafter are not shown), a chip 4 is packaged on the COF 1, and the cover plate fixed on the back side of the back plate of the backlight module covers and protects the printed circuit board 3 and chip 4. A heat dissipation patch 5 covering the chip 4 is attached to the COF 1 to cool the chip 4.

The present disclosure provides a display module and a display device for the sake of improving assembly convenience of the display module, enhancing the heat dissipation performance of the chip, and thus improving the product quality of the display device. To make the objectives, technical solutions, and advantages of the present disclosure more comprehensible, the present disclosure will be further described in detail with reference to the following embodiments.

In the embodiment of the present disclosure, "front" may be understood as a side of a component close to a viewer when a display device including a display module is in normal use, and "back" may be understood as a side of the component away from the viewer.

The specific type of the display module is not limited. For example, the display module may be a TFT-LCD display module, an OLED display module, or the like. Taking the display module of the TFT-LCD as an example, in addition to the above components, the display module generally further includes components such as a backlight module, a front frame, and a back housing. The printed circuit board is located on a back side of the backlight module, and a cover plate is fixed to a back plate through a screw and covers the printed circuit board so as to protect the same.

Figure 3:
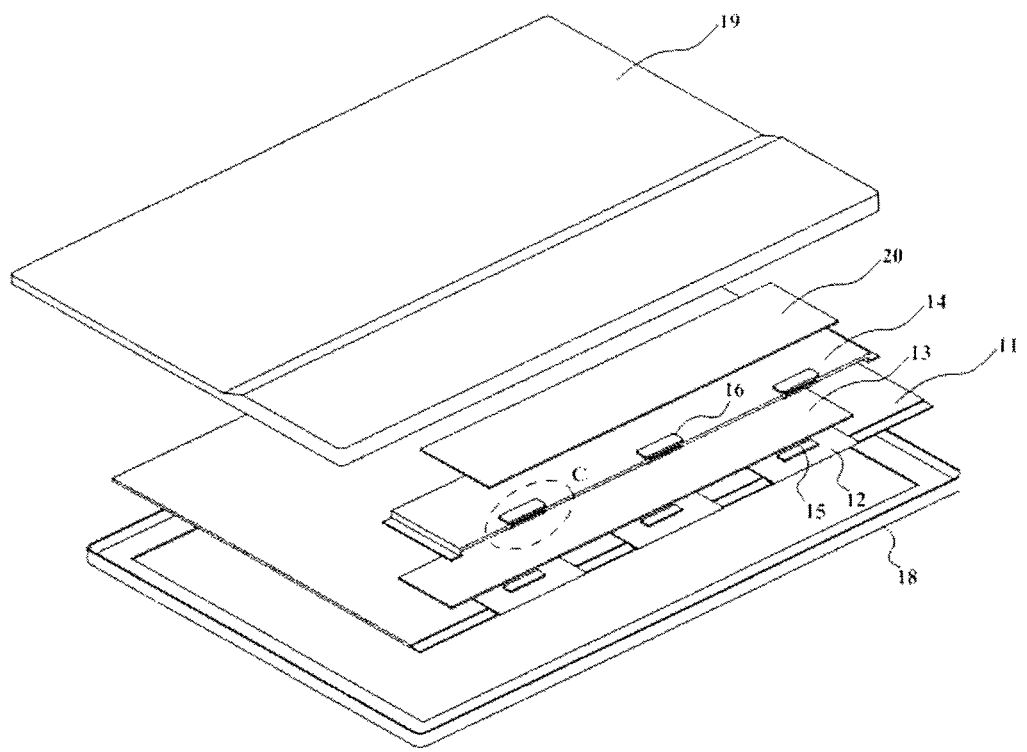
FIG. 3 is an exploded schematic view of a display module according to an embodiment of the present disclosure.
Figure 5:
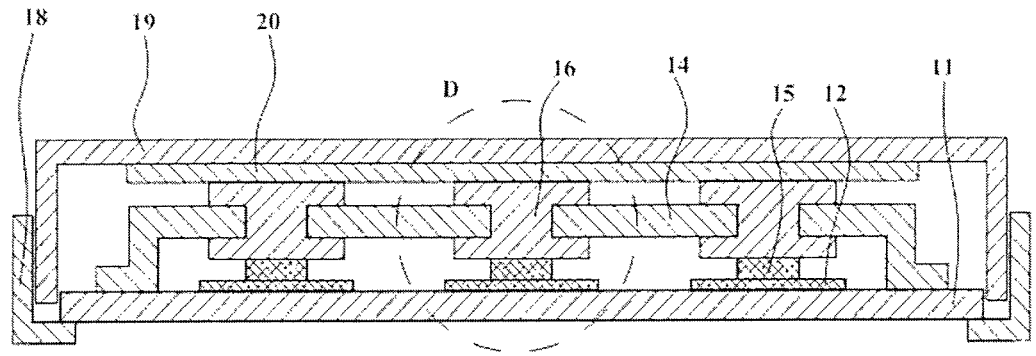
FIG. 5 is a sectional view of a heat dissipation structure of a chip of a display module according to an embodiment of the present disclosure.

As shown in FIGS. 3 and 5, the display module provided by the embodiment of the present disclosure comprises a display panel 11, at least one chip-on-film 12, a printed circuit board 13 and a cover plate 14, the printed circuit board 13 is located on a back side of the display panel 11;

one end of the chip-on-film 12 is connected with the display panel 11, the other end of the chip-on-film 12 is bent towards the back side of the display panel 11 and is connected with a printed circuit board 13, with a chip 15 being packaged therein at a portion of the chip-on-film 12 which is bent towards the back side of the display panel 11;

the cover plate 14 is located on the back side of the printed circuit board 13 and covers the same; and the cover plate 14 is provided with thermal conductive blocks 16 which are in thermal contact with the chip 15 at location(s) of the cover plate 14 corresponding to the chip-on-film(s) 12 respectively.

Generally, the cover plate 14 is made of a metal material having a relatively fine heat dissipation property. Preferably, the cover plate 14 is made of aluminum which is cost saving and has a relatively high thermal conductivity. The cover plate 14 may be shaped depending on the requirements of shape of the printed circuit board 13 and the heat dissipation area.

In the technical solutions of the embodiments of the present disclosure, since the cover plate 14 is provided with thermal conductive blocks 16 which are in thermal contact with the chip 15 on location(s) of the cover plate 4 corresponding to the chip-on-film(s) 12 respectively, the thermal conductive blocks 16 transfer heat of the chip 15 and disperses the heat of the chip 15 onto the cover plate 14, such that heat of the chip 15 is dispersed gradually, enhancing the cooling performance of the chip 15. The specific material types of the heat-conductive block 16 are not limited. For example, it may use an aluminum block, a copper block, a thermal conductive rubber block, or the like. Optionally, a thermal conductive rubber block may be used for example a thermal conductive silicon block, a thermal conductive silicone rubber block, a thermal conductive silica block and the like. The thermal plastic rubber block has a certain elasticity and may be tightly pressed against and contacted with the chip 15 to achieve better thermal conduction and heat dissipation performance for the chip 15. In addition, since the thermal conductive block 16 is connected with the chip 15 without adhesive bonding, assembly of the display module may be simplified, and poor line contact caused by removing the conventional heat dissipation patch may be avoided, thereby improving the product quality of the display device.

Figure 4:
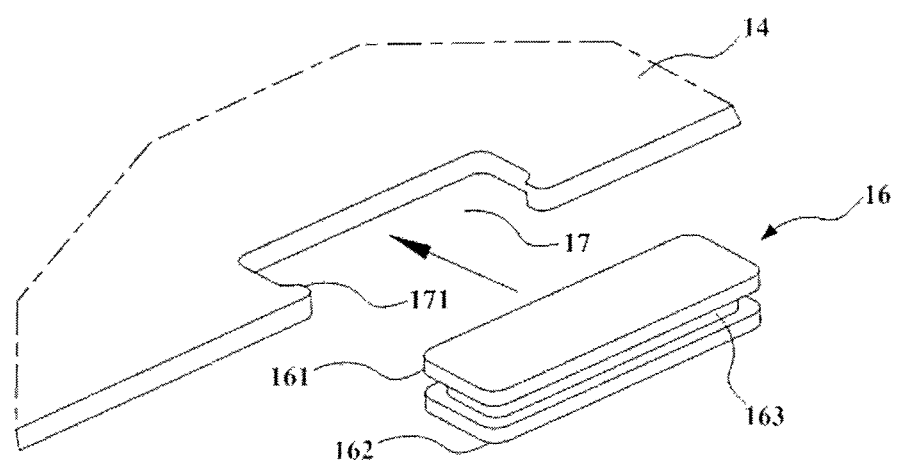
FIG. 4 is an exploded schematic view at a position C in FIG. 3.

As shown in FIGS. 3 and 4, in the embodiment, a notch 17 is provided at each position of the cover plate 14 corresponding to one of the chip-on-film 12, and the thermal conductive blocks 16 are fitted in the notches 17 by interference fit respectively. Such a structure design facilitates the assembly and disassembly between the heat conductive block 16 and the cover 14, so as to facilitate changing the heat conductive block 16 of the suitable material according to the heat dissipating requirement of the chip 15.

Further, the thermal-conducting block 16 comprises a first stopper 161 and a second stopper 162 positioned respectively on either side of the cover plate 14, and a connecting portion 163 fitted with the notches 17 by interference fit. With such a design, the heat conductive block 16 is inserted into and matched with the notch 17 by interference fit, it is easy to assembly and locate the heat conductive block 16 and the cover plate 14, and the heat conductive block 16 may hardly come off from the upper and lower sides of the cover plate 14, thereby making a more secured assembly between the heat conductive block 16 and the notch 17.

Further, a pair of limiting protrusions 171 may be provided at an entrance of the notch 17. With such a design, the heat conductive block 16 may hardly come off from the entrance of the cover plate 17 after the thermal conductive block 16 is fitted with the notch 17, thereby making a more secured assembly between the heat conductive block 16 and the notch 17.

As shown in FIGS. 3 and 5, the display module further comprises a front frame 18 and a back housing 19 connected with the front frame 18, and a heat sink 20 is provided inside the back housing 19, with the display panel 11, the at least one chip-on-film 12, the printed circuit board 13 and the cover plate 14 being located between the front frame 18 and the back housing 10, and the thermal conductive blocks 16 being in thermal contact with the heat sink 20. Optionally, the heat sink 20 is bonded onto an inner surface of the back housing 19. With the heat sink 20 being bonded with the back housing 19, it makes assembly and disassembly of the heat sink 20 more convenient, so it is possible to change the heat sink 20 of an appropriate material or size according to the cooling requirements. The heat of the chip 15 is dissipated through the heat conductive block 16 and then through the heat sink 20, so that heat dissipation efficiency is high. The specific structure of the heat sink 20 is not limited. For example, the heat sink 20 has a laminated structure which comprises at least one of a graphite layer, a metal layer, and a thermal conductive adhesive layer. The back housing 19 is preferably made of a metal material such as aluminum or aluminum alloy, so that the heat transmitted by the heat sink may be rapidly dissipated to the outside.

Figure 6:
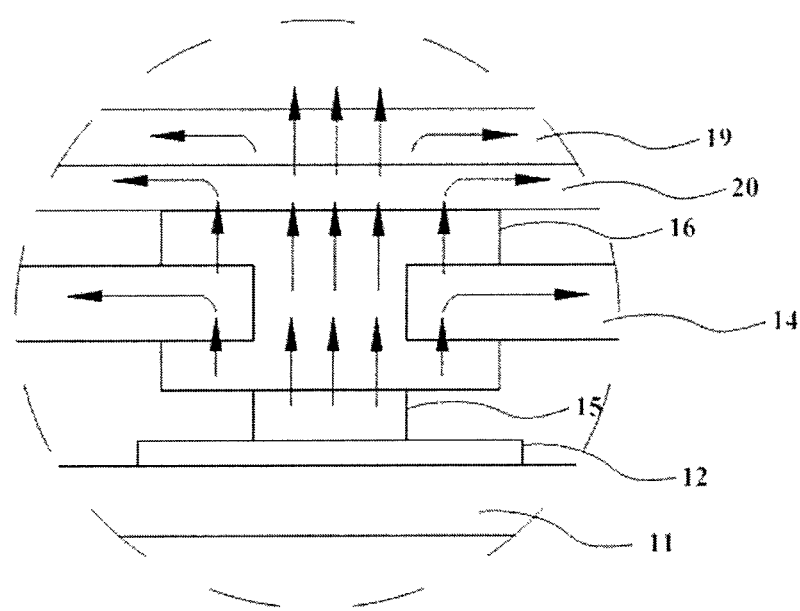
FIG. 6 is a schematic diagram of heat conduction at a position D in FIG. 5.

As shown in FIG. 6, in a direction of the section of the display module, the heat dissipated by the chip 15 is conducted to outside through the heat conductive block 16 and then through the heat sink 20 and the back housing 19 of metal; and simultaneously, in a direction parallel to the display panel 11, the heat dissipated by the chip 15 is dissipated to the cover plate 14, the heat sink 20 and the metal back housing 19 through the heat conductive block 16. The heat of the chip 15 is dissipated step by step through a plurality of components, thereby greatly improving the heat dissipation efficiency as compared with the conventional chip.

As shown in FIGS. 3 and 4, when assembling the display module, each notch 17 of the cover 14 is firstly inserted into the heat conductive block 16, and then the COF 12 and the printed circuit board 13 are bent toward the back side of the display panel 11. Then the cover 14 is fixed on the back side of the display panel 11, such that at that time the cover plate 14 covers the printed circuit board 13, and respective heat conductive blocks 16 are tightly pressed against and together with the corresponding chips 15. Finally, the above components are assembled with the back housing 19 attached with the heat sink 20 and the front frame 18. After the display module is assembled, the chip 15 and the heat conductive block 16 are tightly pressed against each other so as to fit together, and the heat conductive block 16 is in contact with the heat sink 20.

In other embodiment of the present disclosure, the display module further comprises a front frame and a metal back housing connected with the front frame, with the display panel, the at least one chip-on-film, the printed circuit board and the cover plate being located between the front frame and the metal back housing, and the thermal conductive blocks being in thermal contact with the metal back housing. The heat of the chip is dissipated to outside through the thermal conductive block, and then through the metal back housing, cooling efficiency of which is also relatively high.

An embodiment of the present disclosure also provides a display device, comprising the display module according to any one of above solutions. The display module of the display device may be conveniently assembled, the chip has improved heat dissipation effect, and the display device has better product quality. The type of the display device is not limited, and it may be, for example, a flat-screen TV, a flat panel display, a tablet computer, an electronic paper, or the like.

Obviously, those skilled in the art can make various modifications and variations to the present disclosure without departing from the spirit and scope of the disclosure. In this way, if these modifications and variations of the disclosure fall within the scope of the claims of the disclosure and the equivalent technologies, the disclosure is also intended to include these modifications and variations.

What is claimed is:

1. A display module comprising a display panel, at least one chip-on-film, a printed circuit board and a cover plate, wherein,
   the printed circuit board is located on a back side of the display panel;
   one end of the chip-on-film is connected with the display panel, the other end of the chip-on-film is bent towards the back side of the display panel and is connected with the printed circuit board, with a chip being packaged in a portion of the chip-on-film which is bent towards the back side of the display panel;
   the cover plate is located on the back side of the printed circuit board and covers the same; the cover plate being provided with thermal conductive blocks which are in thermal contact with the chip at each location of the cover plate corresponding to one of the chip-on-film respectively, and wherein
   the thermal-conducting block comprises a first stopper and a second stopper positioned on either side of the cover plate respectively, and a connecting portion for connecting the first stopper with the second stopper.

2. The display module according to claim 1, wherein the thermal conductive block is a thermal conductive rubber block.

3. The display module according to claim 1, wherein a notch is provided at each position of the cover plate corresponding to one of the chip-on-film, and the thermal conductive blocks are fitted in the notches by interference fit respectively.

4. The display module according to claim 3, wherein the connecting portion is fitted with the notches by interference fit.

5. The display module according to claim 3, wherein a pair of limiting protrusions are provided at an entrance of the notch.

6. The display module according to claim 1, wherein the display module further comprises a front frame and a metal back housing connected with the front frame, with the display panel, the at least one chip-on-film, the printed circuit board and the cover plate being located between the front frame and the metal back housing successively, and the thermal conductive blocks being in thermal contact with the metal back housing.

7. The display module according to claim 1, wherein the display module further comprises a front frame and a metal back housing connected with the front frame, with a heat sink being provided inside the metal back housing, the display panel, the at least one chip-on-film, the printed circuit board and the cover plate being located between the front frame and the metal back housing successively, and the thermal conductive blocks being in thermal contact with the heat sink.

8. The display module according to claim 7, wherein the heat sink is bonded by adhesive onto the inner surface of the back housing.

9. The display module according to claim 7, wherein the heat sink has a laminated structure which comprises at least one of a graphite layer, a metal layer, and a thermal conductive adhesive layer.

10. A display device, comprising the display module according to claim 1.

11. A display device, comprising the display module according to claim 2.

12. A display device, comprising the display module according to claim 3.

13. A display device, comprising the display module according to claim 4.

14. A display device, comprising the display module according to claim 5.

15. A display device, comprising the display module according to claim 6.

16. A display device, comprising the display module according to claim 7.

17. The display module according to claim 1, wherein the thermal-conducting block has a thickness larger than that of the cover plate, so as to be in a compressive contact with the chip.

18. The display module according to claim 3,
wherein orthographic projections of the first stopper and the second stopper of the thermal-conducting block on the cover plate completely cover the notches.

19. The display module according to claim 7,
wherein the heat sink has a first surface directly contact with the first stopper and a second surface directly contact with the metal back housing.

\* \* \* \* \*